United States Patent
Yang et al.

(10) Patent No.: US 10,446,358 B2
(45) Date of Patent: *Oct. 15, 2019

(54) DATA PROCESSING OF ELECTRON BEAM LITHOGRAPHY SYSTEM

(71) Applicant: Taiwan Semiconductor Manufacturing Co., Ltd., Hsin-Chu (TW)

(72) Inventors: Jensen Yang, Zhubei (TW); Shy-Jay Lin, Jhudong Township (TW); Yen-Hao Huang, Taiwan (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/103,616

(22) Filed: Aug. 14, 2018

(65) Prior Publication Data

US 2019/0139733 A1 May 9, 2019

Related U.S. Application Data

(62) Division of application No. 15/143,246, filed on Apr. 29, 2016, now Pat. No. 10,049,851.

(51) Int. Cl.
*H01J 37/00* (2006.01)
*H01J 37/317* (2006.01)

(52) U.S. Cl.
CPC .......... *H01J 37/00* (2013.01); *H01J 37/3174* (2013.01); *H01J 2237/31762* (2013.01)

(58) Field of Classification Search
CPC ................... H01J 37/00; H01J 37/3174; H01J 2237/31762
See application file for complete search history.

(56) References Cited

U.S. PATENT DOCUMENTS

| | | | |
|---|---|---|---|
| 7,566,882 B1* | 7/2009 | Hess | B82Y 10/00 250/396 R |
| 8,464,186 B2 | 6/2013 | Wang et al. | |
| 8,468,473 B1 | 6/2013 | Wang et al. | |
| 8,473,877 B2 | 6/2013 | Wang et al. | |
| 8,507,159 B2 | 8/2013 | Wang et al. | |
| 8,510,687 B1 | 8/2013 | Liu et al. | |
| 8,524,427 B2 | 9/2013 | Shin et al. | |
| 8,530,121 B2 | 9/2013 | Wang et al. | |
| 8,563,224 B1 | 10/2013 | Chen et al. | |
| 8,584,057 B2 | 11/2013 | Liu et al. | |
| 8,601,407 B2 | 12/2013 | Wang et al. | |

(Continued)

*Primary Examiner* — Wyatt A Stoffa
*Assistant Examiner* — Sean M Luck
(74) *Attorney, Agent, or Firm* — Haynes and Boone, LLP (57) ABSTRACT

A method includes receiving, by an input buffer of a switching device, a packet, determining, by a scheduling engine of the switching device, a destination output buffer for the packet, receiving, by the scheduling engine of the switching device, an availability of the destination output buffer and a vacancy level of a memory device that is associated with the destination output buffer, and based on the availability of the destination output buffer and the vacancy level of the memory device, determining, by the scheduling engine of the switching device, a routing destination of the packet. The routing destination includes the input buffer, the destination output buffer, and the memory device.

20 Claims, 5 Drawing Sheets

(56) References Cited

U.S. PATENT DOCUMENTS

| | | |
|---|---|---|
| 8,609,308 B1 | 12/2013 | Chen et al. |
| 8,627,241 B2 | 1/2014 | Wang et al. |
| 8,677,511 B2 | 3/2014 | Wang et al. |
| 8,762,900 B2 | 6/2014 | Shin et al. |
| 8,822,106 B2 | 9/2014 | Wang et al. |
| 8,828,632 B2 | 9/2014 | Wang et al. |
| 8,835,082 B2 | 9/2014 | Chen et al. |
| 8,841,049 B2 | 9/2014 | Wang et al. |
| 8,846,278 B2 | 9/2014 | Shin et al. |
| 2008/0145767 A1* | 6/2008 | Lordi .................. B82Y 10/00 430/5 |

* cited by examiner

DATA PROCESSING OF ELECTRON BEAM LITHOGRAPHY SYSTEM

PRIORITY INFORMATION

This application is a divisional of U.S. patent application Ser. No. 15/143,246 filed Apr. 29, 2016, and entitled "Data Processing of Electron Beam Lithography System," the disclosure of which is hereby incorporated by reference in the entirety.

BACKGROUND

Semiconductor integrated circuit (IC) fabrication involves forming multiple material layers with designed patterns on a semiconductor wafer. Those patterned material layers on the semiconductor wafer are aligned and configured to form one or more functional circuits. Photolithography systems are used to pattern a semiconductor wafer. When semiconductor technology continues progressing to circuit layouts having smaller feature sizes, a lithography system with higher resolution is need to image an IC pattern with smaller feature sizes. An electron-beam (e-beam) system is introduced for lithography patterning processes as the electron beam has wavelengths that can be tuned to very short, resulting in very high resolution. An e-beam lithography can write small features to a wafer but takes longer time. The corresponding fabrication cost is higher and cycle time is too long. Although existing methods of fabricating IC devices have been generally adequate for their intended purposes, they have not been entirely satisfactory in all respects. For example, devices and process for reducing costs and cycle time in a-beam lithography system is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Until recently it was not feasible to consider electron beam (e-beam) lithography as an efficient method of mass producing wafers. Typical e-beam writers, while intensely precise, have extremely long process times making them notoriously slow. In fact, such e-beam writers, due to the low rate of pattern transfer, are usually only used to form masks or small portions of wafers requiring extraordinary precision. With the recent advent of newer type e-beam lithography devices/systems, it has become increasingly more likely that such systems may be used to pattern wafers on a more substantially large scale. Such systems include certain Digital/Dynamic Pattern Generators (DPGs) which embody new possibilities for Direct Write (DW) using e-beam lithography. In addition to the foregoing, the advent of reflective electron beam lithography (REBL) also presents potential(s) for new processing technologies.

Although such systems show tremendous potential, they also present enormous application challenges to those of ordinary skill in the photolithographic arts. One among many such challenges is a data-processing challenge, or more particularly, a data-routing challenge. Most current and conventional systems implementing DPGs to transfer (write) a pattern on a substrate (e.g., a wafer and/or a mask) rely on a plurality of transmission lines (e.g., optical fibers) for transmitting pattern data from a server (e.g., a pattern data database) to a DPG. Such a DPG may include a plurality of mirrors that are configured to receive the (processed) pattern data and based on the process pattern data to direct (e.g., reflect) an electron-beam on a substrate. It is appreciated that such pattern data change as an e-beam is scanned across a substrate. Thus, a tremendous amount of information/data must be transmitted through the transmission lines. For example, data rates at the order of tens of terabit (Tb) per second ($10^{+12}$ bps) are required to enable many of these technologies in order to produce a reasonable throughput.

However, conventional systems using the transmission lines to transmit the pattern data are generally subjected to a variety of issues such as, for example, non-uniformity of effective transmission rates over the plurality of the transmission lines. More particularly, in conventional systems, each transmission line is designated to (and coupled to) one of mirrors of the DPG. That is, pattern data transmitted through a transmission line can only go to its designated mirror of a DPG. As such, the throughput of the conventional system may suffer from one or more malfunctioning transmission lines and/or may be limited by a transmission line with a relatively slower effective transmission rate. Thus, it is desirable to provide a system that allows pattern data to be dynamically routed and, in turn, may be free of the above-identified issues. The present disclosure provides a variety of embodiments of systems and methods that enables pattern data to be dynamically routed to desired destinations (e.g., mirrors of a DPG) even those experiencing malfunctioning(s) of transmission line(s).

Figure 1:
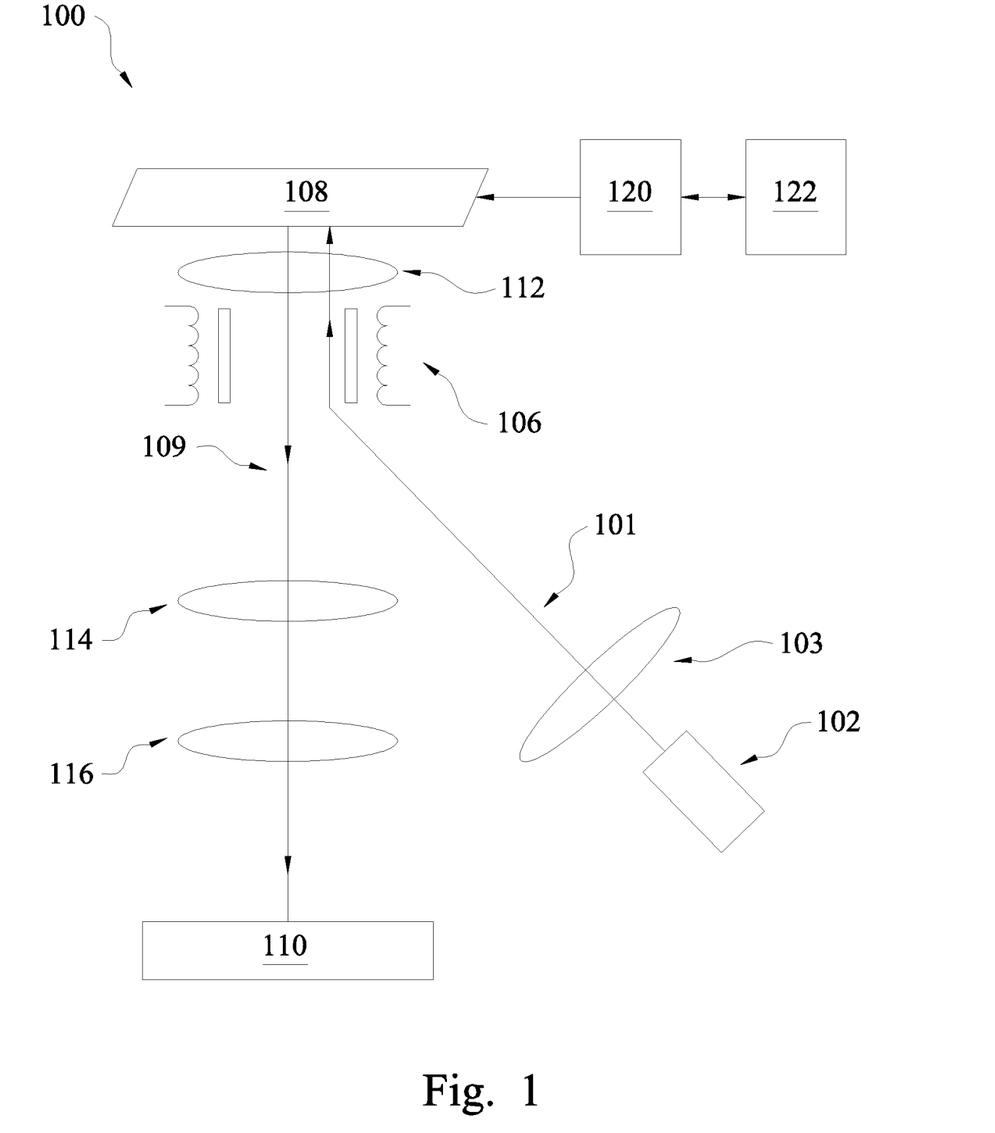
FIG. 1 illustrates an example of an electron-beam lithography system in accordance with some embodiments of the present disclosure.

FIG. 1 illustrates a schematic view of an electron-beam (or e-beam) lithography system 100 constructed according to aspects of one embodiment of the present disclosure. The electron-beam lithography system 100 is an electron-based lithography technique that utilizes an electron-based imaging for various integrated circuits (IC) patterning. The electron-beam lithography system 100 transfers an IC design pattern to an e-beam sensitive resist (e-beam-resist or resist) layer coated on a substrate, such as a semiconductor wafer. The electron-beam lithography system 100 provides a higher imaging resolution than that of an optical lithography because an electron beam can be energized to have a shorter wavelength. In a specific embodiment of the present disclosure, the e-beam lithography system 100 is a reflective e-beam lithography system that transfers an IC pattern to an e-beam resist layer. However, the embodiment of the present disclosure may be used in any of a variety of lithography systems while remaining within the scope of the present disclosure.

In the illustrated embodiment of FIG. 1, the electron-beam lithography system 100 includes an electron source 102 to provide an electron beam 101. In furtherance of the embodiment, the electron source 102 is an electron gun with a mechanism to generate electrons, such as by thermal electron emission. In a particular example, the electron gun includes a tungsten (or other suitable material) filament that is configured to be biased to thermally emit electrons. The electron-beam lithography system 100 may further include e-beam lens (gun lens) 103 configured in the front of the e-beam source 102 to control the e-beam, such controlling the e-beam to have a proper direction and/or a beam size. In one embodiment, the gun lens 103 may tune the e-beam from the e-beam source 102 to have a large spot with a uniform space distribution. In another embodiment, the e-beam from the e-beam source 102 may be further processed to have a proper beam spot and uniformity by other electron lenses. In some embodiments, referring still to FIG. 1, the electron-beam lithography system 100 may further include a Wien filter 106 as an e-beam filter. The Wien filter 106 includes a module to generate perpendicular electric and magnetic fields that are used as a velocity filter for the e-beam.

Figure 2:
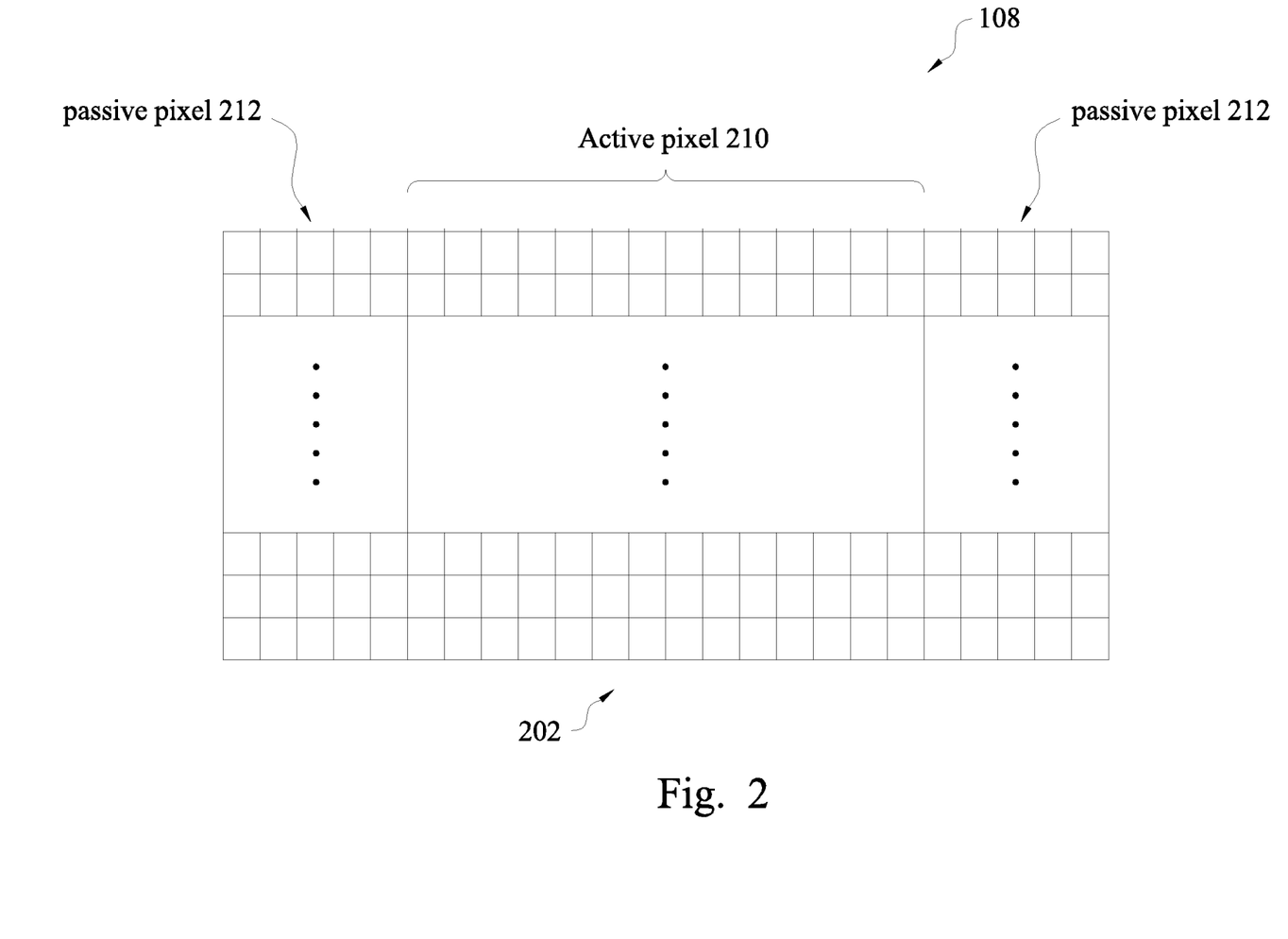
FIG. 2 illustrates an example of a digital pattern generator in accordance with some embodiments of the present disclosure.

Referring still to FIG. 1, the electron-beam lithography system 100 includes a digital/dynamic pattern generator (DPG) 108 to generate a patterned e-beam array. The DPG 108 is a structure that includes a plurality of pixels/mirrors configured in an array, as illustrated in FIG. 2 constructed according to one embodiment. In the illustrated embodiment of FIG. 2, the plurality of pixels 202 are configured in an array that spans in a rectangle. In one example, the pixels 202 include a first group as active pixels 210 and a second group as passive pixels 212. The pixels are dynamically and individually controllable to on-state and off-state. For example, a first subset of the pixels (e.g., 210) is controlled to on-state and a second subset of the pixels (e.g., 212) is controlled to off-state. In this particular embodiment, only the active pixels are controlled to toggle between on and off states. When a pixel is on, the pixel reflects the e-beam (or a portion of the e-beam) projected on that pixel. When a pixel is off, the pixel does not reflect the e-beam (or a portion of the e-beam) projected on that pixel. The DPG 108 includes a mechanism to enable individual pixel to toggle between on and off states. In one embodiment, the DPG 108 includes an integrated circuit (IC) based chip having an array of pixels controllable by a built-in drive circuit or a coupled controller. In an example (as illustrated in FIG. 1), a controller 120 coupled to the DPG 108 may be configured to receive pattern data and/or processed pattern data from a pattern data server/database 122 and to route the received pattern data so as to control the DPG 108, or more specifically, the pixels 202 of the DPG 108. As such, the controller 120 may serve as a switch that is configured to route already processed pattern data to designated destination(s) or, alternatively, a data processing unit, in addition to routing pattern data, that is further configured to process pattern data before routing. Although the following discussion of the embodiment of the controller 120 is directed to implementing the controller 120 as a switch, the controller 120 may further include a variety of other functions such as data processing while remaining within the scope of the present disclosure.

As described above and illustrated in the embodiment of FIG. 2, the DPG 108 includes an array of e-beam (mirror) pixels that are individually and dynamically controlled, based on the processed pattern data provided/routed by the controller 120, to reflect the e-beam projected thereon (e.g., 101) to form an e-beam pattern 109. Although the illustrated embodiment of FIG. 1 shows that the controller 120 directly communicates with the DPG 108 to enable the pixels of the DPG 108 to be controller/modulated, in accordance with various other embodiments, the system 100 may further include one or more components that are physically or electrically coupled between the DPG 108 and the controller 120. In some examples, such a component may include a data processing unit, or more specifically, a data decompressing unit. The reflected e-beam pattern 109 is further projected on a wafer 110 positioned on a wafer stage. In accordance with various further embodiments, the e-beam lithography system 100 may also include one or more lenses to modulate the e-beam for imaging effect. In an example, the e-beam lithography system 100 may include a DPG lens 112, an upper demagnification (demag) lens 114 and a lower demag lens 116 as illustrated in FIG. 1.

Figure 3:
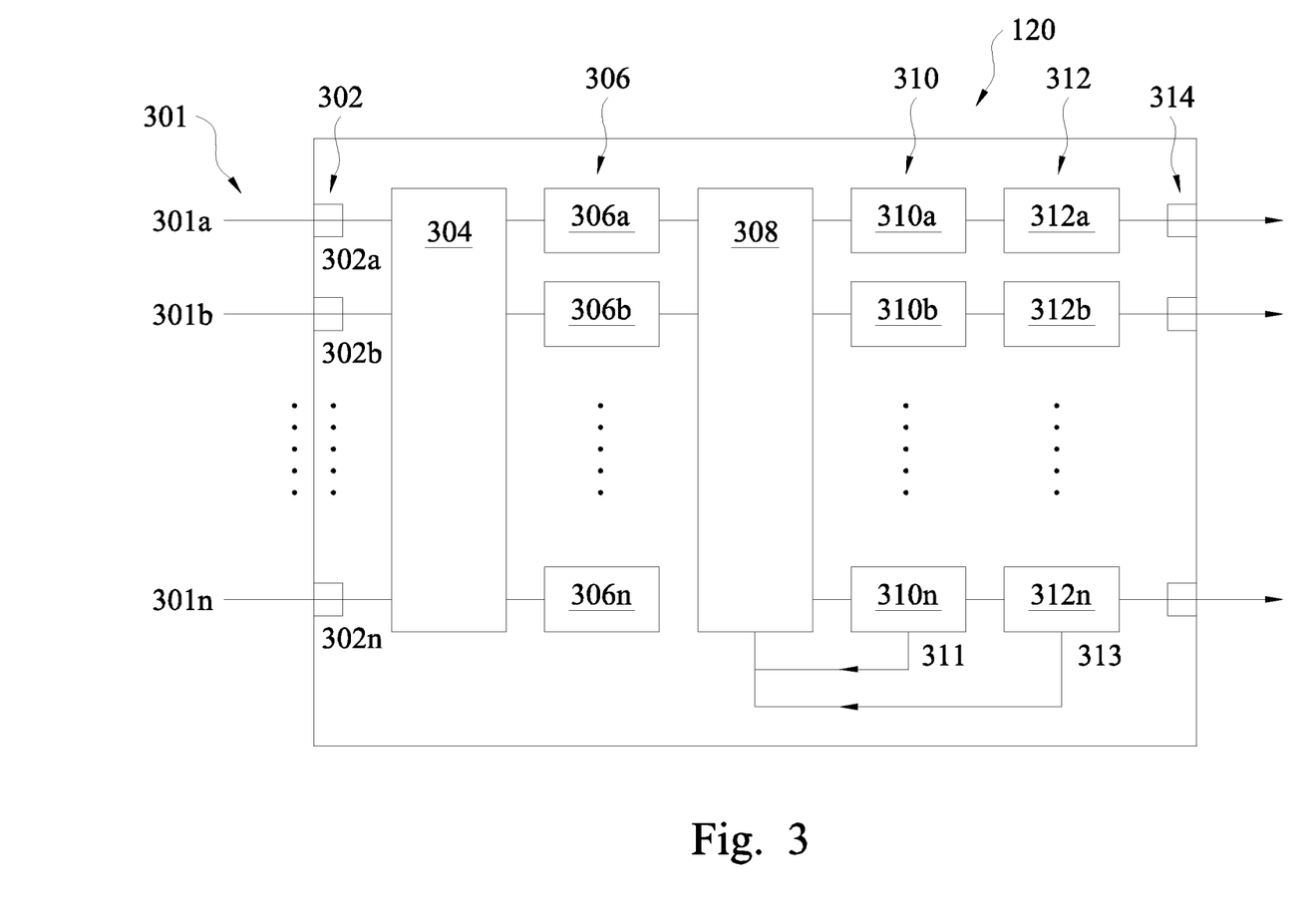
FIG. 3 illustrates an example of a switching device in an electron-beam lithography system in accordance with some embodiments of the present disclosure.

FIG. 3 illustrates an embodiment of the controller 120 that is coupled to the DPS 108 and configured to route processed pattern data so as to control the pixels of the DPG 108 as described with respect to FIG. 1. As illustrated in FIG. 3, the controller 120 includes a plurality of input ports 302, a transceiver 304, a plurality of input buffers 306, a scheduling engine 308, a plurality of output buffers 310, a plurality of memory devices 312, and a plurality of output ports 314. Although the embodiment of FIG. 3 shows that the controller 120 is configured to route processed pattern data in an e-beam lithography system, the controller 120 may be used to route a variety of data such as, for example, networking data, power over Ethernet data, etc., while remaining within the scope of the present disclosure.

Referring still to FIG. 3, the input ports 302 are configured to connect the controller 120 to the pattern data database 122 through transmission lines 301. As shown, transmission lines 301 include transmission lines 301a through 301n, where n is an integer representing that there can be any number of transmission lines. Also, as shown, input ports 302 include input ports 302a through 302n, where n is an integer representing that there can be any number of input ports. In some specific embodiments, in order to accommodate such a high transmission rate in an e-beam lithography system (e.g., 100), the transmission line 301 may be implemented as optical fibers. In some embodiments, the transceiver 304 is configured to receive pattern data from the pattern data database 122 through transmission line 301, and in some alternative embodiments, the transceiver 304 is further configured to report (transmit) availabilities of the output buffers 310 and vacancy levels of the memory devices 312 to the pattern data database 122 through the transmission lines 301, which will be described further below.

In some specific embodiments of the present disclosure, the pattern data received by the transceiver 304 may include a plurality of packets. In an example, the pattern data may be divided into a plurality of packets and each of such a plurality of packets is transmitted through a transmission line 301. Generally, such a packet may include a header and a payload, whereby the header may include destination data by which of the components (e.g., output buffer 310/memory device 312) the packet should be received; and the payload may include, at least in part, the (processed) pattern data. Referring still to FIG. 3 and continuing with the example of transmitting the pattern data as packets to the transceiver 304, the input buffers 306 are configured to receive the plurality of packets from the transceiver 304, and further configured to hold the received packets (if needed), which will be described below. More specifically, each of the input buffers 306 is coupled to a transmission line 301. As shown, input buffers 306 include input buffers 306a through 303n, where n is an integer representing that there can be any number of input buffers. In the present embodiment, for example (as illustrated in FIG. 3), input buffer 306a is coupled to transmission line 301a through the transceiver 304; and input buffer 306b is coupled to transmission line 301b through the transceiver 304. As such, a packet being transmitted by the transmission line 301a may be received or held (if needed) by the input buffer 306a; and another packet being transmitted by the transmission line 301b may be received or held (if needed) by the input buffer 306b.

Referring still to FIG. 3, the output buffers 310 are coupled to the scheduling engine 308 and each of the output buffers 310 is coupled with an associated memory device 312, whereby each of the memory devices 312 may be coupled to a pixel of the DPG through output port 314. As shown, output buffers 310 include output buffers 310a through 310n, where n is an integer representing that there can be any number of output buffers. Additionally, memory devices 312 include memory devices 312a through 312n, where n is an integer representing that there can be any number of memory devices. Also, output ports 314 include output ports 314a through 314n, where n is an integer representing that there can be any number of memory devices.

Figure 4:
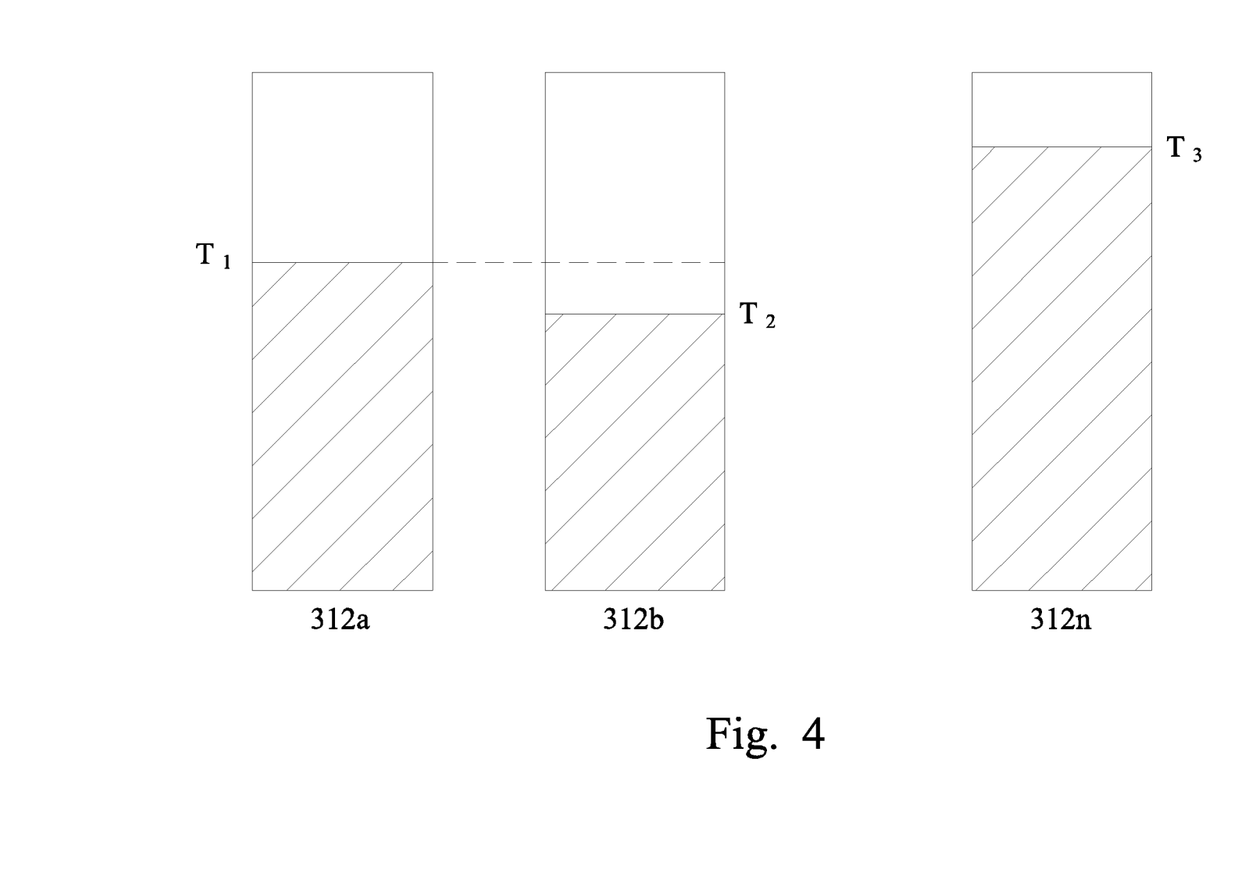
FIG. 4 illustrates an example of a plurality of memory devices of the switching device of FIG. 3 in accordance with some embodiments of the present disclosure.

Data stored in the memory device 312 may be used directly or indirectly to control/reflect the pixel(s) of the DPG. In some embodiments, the memory device 312 may include a first in first out (FIFO) logic device, which means that each of the memory devices 312 may include a maximum threshold amount of stacks (queues/spaces) and a specific FIFO sequence. In some embodiments, the maximum threshold amount of stacks for each memory device 312 may vary. For example, as shown in FIG. 4, the memory device 312a may have a maximum threshold "$T_1$", the memory device 312b may have a maximum threshold "$T_2$", and the memory device 312n may have a maximum threshold "$T_3$", whereby $T_1$ is greater than $T_2$ and $T_3$ is greater than $T_1$. In accordance with some embodiments, such a FIFO sequence may correspond to that the oldest (first) entry of the memory device 312, or 'head' of the queue, will be processed/output first. Further, each of the output buffers 310 may provide its availability through feedback line 311 to the scheduling engine 308; and each of the memory devices 312 may provide its vacancy level through 313 to the scheduling engine 308. By "availability of each output buffer", it is meant that each output buffer may include a threshold that is directed to a maximum amount of packets that output buffer can store. If the output buffer has reaches such a maximum threshold, the availability of the output buffer (i.e., 311) may be a logic value that corresponds to "0" (i.e., the output buffer is "unavailable" to receive/hole any packet). If the output buffer has not reached the maximum threshold, the availability of the output buffer (i.e., 311) may be a logic value that corresponds to "1" (i.e., the output buffer is "available" to receive/hole packet(s)). By "vacancy level of each memory device", it is meant that each memory device may report how many stacks left in the memory device are available to store a packet. By using the availability of each of the output buffers 310 and the vacancy level of each of the memory devices 312, the scheduling engine 308 is able to dynamically route each of the packets in the input buffers 306 to its designated destination more efficiently. Details of the function(s) of the scheduling engine 308 are described below.

The scheduling engine 308 is configured to read the header of each packet and thus acknowledges where each of the packets is designated to go. Before the scheduling engine 308 routes a packet to its designated destination (output buffer/memory device), the scheduling engine 308 first receives the reported availability of the packet's designated output buffer 310 and the vacancy level of the packet's designated memory device 312. Then by examining the availability of the designated output buffer 310 and the vacancy level of the designated memory device 312, the scheduling engine 308 determines whether to route the packet or keep the input buffer 306 (where the packet originally resides) to hold the packet. Generally, the scheduling engine 308 first determines whether the designated output buffer 310 is available. If yes, the scheduling engine 308 routes the packet to the designated output buffer 310. If not, the packet is held in the input buffer and the scheduling engine 308 does not switch the packet until the designated output buffer becomes available. In some embodiments, the scheduling engine 308 may periodically receive the availability information of the output buffer(s) at a predefined rate.

Continuing with the "yes" route, the scheduling engine 308 may route the packet to its designated memory device 312 or hold the packet in the output buffer 310. In an example, after the packet is routed to its designated output buffer, the scheduling engine 308 may further determine whether the vacancy level of the designated memory device 312 is high (i.e., a lot of empty stacks in the memory device). If so, the scheduling engine 308 may further determine whether the packet meets the FIFO sequence of the designated memory device 312. If both of the conditions are met (high vacancy level and correct FIFO sequence), the scheduling engine 308 may then route the packet to the memory device 312. If one of the conditions fails (either the vacancy level is low or wrong FIFO sequence), the scheduling engine 308 may hold the packet in the output buffer 310.

Continuing with the example in which one of the conditions fails, if the failed condition is due to the low vacancy level, by periodically receiving the vacancy level of the memory device 312, the scheduling engine 308 may wait for the vacancy level of the memory device 312 reduces to a predetermined threshold to route the packet to the memory device 312. If the failed condition is due to the wrong FIFO sequence, the scheduling engine 308 may hold the packet in the output buffer 310 and wait for another packet that corresponds to the correct FIFO sequence to show up (to receive from the input buffers 306). More specifically, as each memory device 312 has a FIFO sequence, packets routed from the output buffer 310 must be sequentially lined up for the associated memory device. For example, in the illustrated embodiment of FIG. 3, the memory device 312a has a FIFO sequence: PKT1, PKT2, and PKT3. PKT1 corresponds to a packet with sequence identification NO.1; PKT2 corresponds to a packet with sequence identification NO.2; PKT3 corresponds to a packet with sequence identification NO.3. The sequence identification may be included in the header or payload of each packet, and in some embodiments, the sequence identification may correspond to a relative position over time of each packet. That is, the packet with the sequence identification NO.1 (PKT1) may mean that the packet PKT1 has to be stacked in the memory device 312a earlier than the packet with the sequence identification NO.2 (PKT2), and the packet PKT2 has to be stacked in the memory device 312a earlier than the packet with the sequence identification NO.3 (PKT3). Thus, if the scheduling engine 308 determines that the current packet stored in the output buffer 310a (awaited to be routed to the memory device 312a) is the packet PKT2 and the memory device 312a has not received/stacked the packet PKT1, the scheduling engine 308 may in turn hold the packet PKT2 in the output buffer 310a and waits the packet PKT1 to show up.

Figure 5:
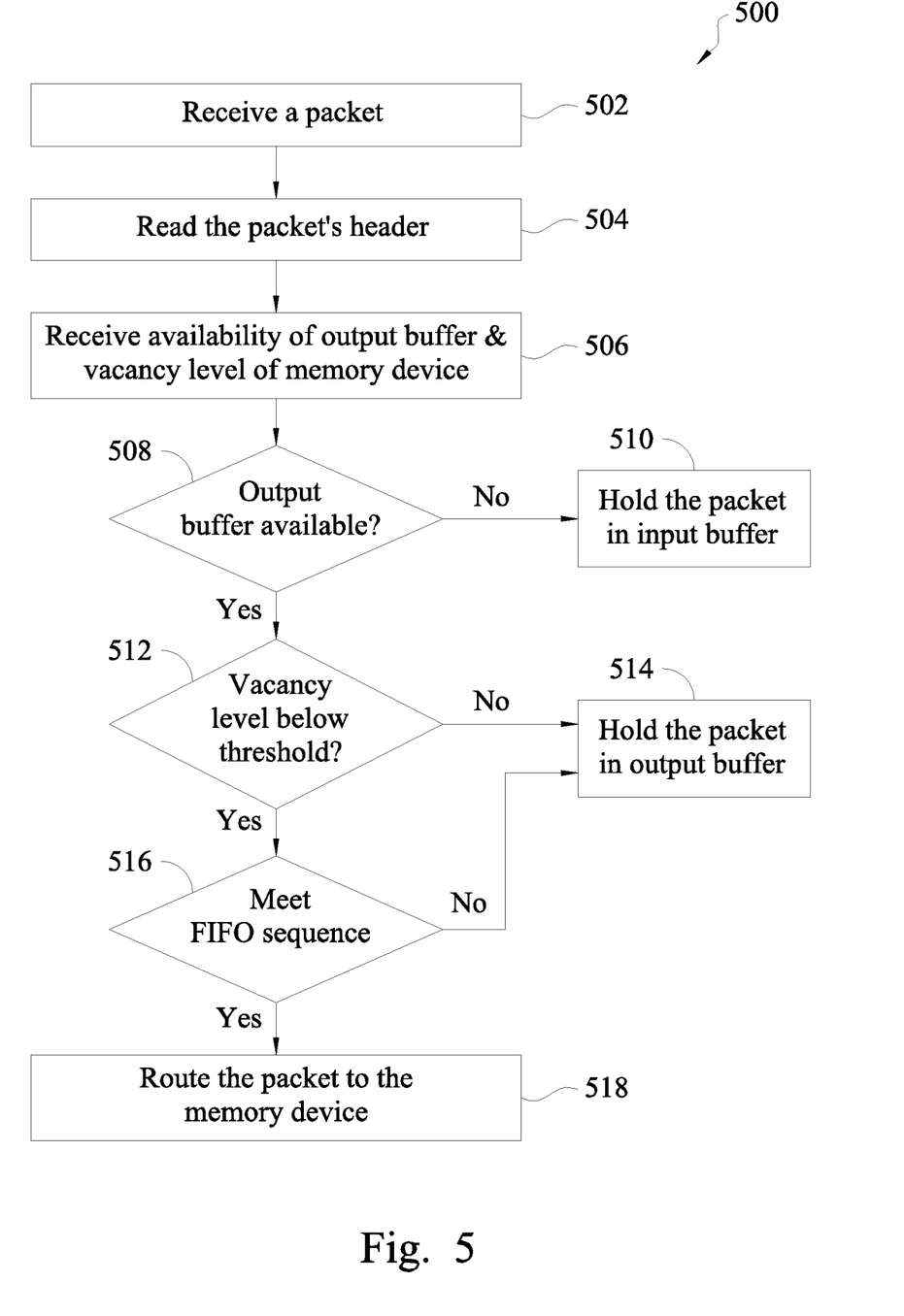
FIG. 5 illustrates a flow chart of a method to dynamically route a packet in accordance with some embodiments of the present disclosure.

FIG. 5 illustrates a flow chart of a method 500 for dynamically routing packet data in accordance with various embodiments. Generally, the embodiment of the method 500 is used in an e-beam lithography system (e.g., 100). However, the embodiment of the method 500 may be used in any of a variety of systems that require data routing such as, for example, a network switching system, a power management system, etc., while remaining within the scope of the present disclosure. The embodiment of the method 500 is merely an example. Thus, additional operations can be provided before, during, and after the method 500, and some operations described can be replaced, eliminated, or moved around for additional embodiments of the method.

The following discussion of the method 500 will be provided in conjunction with the embodiment of the controller 120 in FIG. 3. The method 500 starts at operation 502 with the controller 120 receiving one or more packets. More specifically, the transceiver 304 of the controller 120 is configured to receive the one or more packets through the transmission lines 301 and the one or more packets are stored in input buffers 306. As described above, each of the transmission lines 301 is coupled to an input buffer. For example, the packet transmitted through transmission line 301a may be stored in its coupled input buffer 306a.

Continuing with the above-provided example, the method 500 continues to operation 504 with reading, by the scheduling engine 308, the header of the packet stored in the input buffer 306a. In some embodiments, the header of the packet includes a destination of the packet, which means that the packet should arrive at (received by) one of the output buffers 310/memory devices 312. The method 500 continues to operation 506 with receiving, by the scheduling engine 308, availability of each of the output buffers 310 and vacancy level of each of the memory devices 312. By examining the availability of each of the output buffers 310 and vacancy level of each of the memory devices 312, the scheduling engine 308 may determine whether to route the packet to its destination (e.g., output buffer) or to hold the packet in the input buffer until its destination becomes available again, which will be described as follows.

The method 500 continues to operation 508 with determining, by the scheduling engine 308, whether the packet's destination is available to receive the packet. In some embodiments, such a determination may be based on the availability of each of the output buffers 310. If the packet's destination (one of the output buffers 310) is available, the packet may be routed to its destination output buffer and the method 500 routes to another determination operation 512. If the packet's destination (one of the output buffers 310) is not available, the method 500 routes to operation 510 in which the input buffer (e.g., 306a) holds the packet and, in some further embodiments, the scheduling engine 308 may later route the packet to its destination after the destination becomes available again.

Referring back to operation 512 in FIG. 5, the scheduling engine 308 further examines the vacancy level of one of the memory devices 312 that is coupled to one of the packet's destination (one of the output buffers 310). In some embodiments, in operation 512, the scheduling engine 308 may determine whether the vacancy level of the memory device (the destination memory device) is below a predefined threshold. Such a predefined threshold may be a constant value stored in the scheduling engine 308, or in some alternative embodiments, a dynamically changing value that is calculated/updated by the scheduling engine 308. In accordance with various illustrative embodiments, such a predefined threshold for a memory device should not exceed the memory device's maximum threshold amount of stacks (queues/spaces). If the scheduling engine 308, at operation 512, determines that the vacancy level is below the predefined threshold, the method 500 routes to operation 516 with further determining the packet meets the FIFO sequence of the memory device. On the other hand, if the scheduling engine 308, at operation 512, determines that the vacancy level is not below the predefined threshold, the method 500 routes to operation 514 with holding the packet in the destination output buffer.

Referring still to FIG. 5, at operation 516, the scheduling engine 308 determines whether the packet meets the FIFO sequence of the destination memory device. If not (e.g., a wrong sequence identification or a most updated sequence identification), the method 500 routes to operation 514 in which the destination output buffer holds the packet and the scheduling engine 308 waits for the packet with a correct (or most updated) sequence identification before routing the packet with the wrong (or outdated) sequence identification. If the packet meets the FIFO sequence, at operation 516, the method 500 continues to operation 518 in which the scheduling engine 308 routes/outputs the packet from the output buffer to the coupled memory device.

The present disclosure provides various embodiments of an electron-beam (e-beam) lithography system to provide the above-mentioned advantages over the prior arts. In an embodiment, the system includes a digital pattern generator (DPG) having a plurality of pixels that are dynamically and individually controllable; a switching device that is coupled to a digital pattern generator (DPG), the switching device configured to route a packet to the DPG so as to control at least one of the pixels, the switching device further comprising: a plurality of input buffers configured to receive and store the packet through a transmission line; a plurality of output buffers; a plurality of memory devices, wherein each of the plurality of memory devices is associated with one of the plurality of output buffers; and a scheduling engine that is coupled to the plurality of input buffers, the plurality of output buffers, and the plurality of memory devices and is configured to determine a routing path for the packet stored in one of the input buffers based on an availability of the output buffers and a vacancy level the memory devices.

In another embodiment, the system includes an e-beam source to generate an e-beam; a digital pattern generator (DPG) having a plurality of pixels that are dynamically and individually controllable to reflect the e-beam; a switching device that is coupled to the DPG and that is configured to route a packet to the DPG so as to control at least one of the pixels, the switching device further comprising: a plurality of input buffers wherein one of the plurality of input buffers is configured to receive and store the packet through a transmission line; a plurality of output buffers; a plurality of memory devices, wherein each of the plurality of memory devices is associated with one of the plurality of output buffers; and a scheduling engine that is coupled to the plurality of input buffers, the plurality of output buffers, and the plurality of memory devices and is configured to determine a routing path for the packet stored in the one of the input buffers based on an availability of one of the output buffers and a vacancy level of one of the memory devices.

Yet in another embodiment, a method for routing a packet in an e-beam lithography system includes receiving, by an input buffer of a switching device, a packet; determining, by a scheduling engine of the switching device, a destination output buffer for the packet; receiving, by the scheduling engine of the switching device, an availability of the destination output buffer and a vacancy level of a memory device that is associated with the destination output buffer; and based on the availability of the destination output buffer and the vacancy level of the memory device, determining, by the scheduling engine of the switching device, a routing destination of the packet, wherein the routing destination includes the input buffer, the destination output buffer, and the memory device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for routing data for an e-beam writer, the method comprising:
   with a switching device of the e-beam writer, receiving a packet through one of a plurality of input buffers;
   with a scheduling engine of the switching device, routing the packet to one of a plurality of output buffers, wherein the routing is based on availabilities of the plurality of output buffers and vacancy levels of memory devices associated with the plurality of output buffers; and
   with the switching device, outputting the packet from an output port associated with a memory device to which the packet is routed.

2. The method of claim 1, further comprising, with the scheduling engine, receiving data indicating the availabilities of the plurality of output buffers.

3. The method of claim 1, further comprising, with the scheduling engine, receiving data indicating the vacancy levels of the memory devices.

4. The method of claim 1, further comprising, in response to determining that no output buffer is available, holding the packet in the input buffer.

5. The method of claim 1, further comprising, in response to determining that one of the plurality of output buffers is available, determining whether a vacancy of one of the memory devices is below a threshold.

6. The method of claim 5, further comprising, in response to determining that the vacancy of the one of the memory devices is above the threshold, holding the packet in the one of the plurality of output buffers.

7. The method of claim 5, further comprising, in response to determining that a vacancy of one of the memory devices is below a threshold, determining whether the packet meets a First In First Out (FIFO) sequence.

8. The method of claim 7, further comprising, in response to determining that the packet does not meet the FIFO sequence, holding the packet in the one of the plurality of output buffers.

9. The method of claim 7, further comprising, in response to determining that the packet meets the FIFO sequence, routing the packet to the one of the memory devices.

10. The method of claim 1, wherein the e-beam writer includes a digital pattern generator.

11. The method of claim 10, wherein the digital pattern generator includes a plurality of pixels that are dynamically and individually controllable.

12. A method comprising:
    receiving, by an input buffer of a switching device, a packet;
    determining, by a scheduling engine of the switching device, a destination output buffer for the packet;
    receiving, by the scheduling engine of the switching device, an availability of the destination output buffer and a vacancy level of a memory device that is associated with the destination output buffer; and
    based on the availability of the destination output buffer and the vacancy level of the memory device, determining, by the scheduling engine of the switching device, a routing destination of the packet,
    wherein the routing destination includes the input buffer, the destination output buffer, and the memory device.

13. The method of claim 12, wherein the input buffer is one of a plurality of input buffers.

14. The method of claim 12, wherein the output buffer is one of a plurality of output buffers.

15. The method of claim 12, wherein the memory device is one of a plurality of memory devices.

16. The method of claim 12, further comprising, delivering the packet from the switching device to a Digital Pattern Generator (DPG) of an e-beam writer.

17. The method of claim 16, further comprising, with the digital pattern generator, forming a pattern on a substrate in accordance with data in the packet.

18. A method for routing data for an e-beam writer, the method comprising:
    with a switching device of the e-beam writer, receiving a packet through an input buffer;
    with a scheduling engine of the switching device, routing the packet to one of: the input buffer, an output buffer, and a memory device associated with the output buffer, wherein the routing is based on an availability of the output buffer and a vacancy of the memory device; and with the switching device, outputting the packet from an output port associated with the memory device to a Digital Pattern Generator (DPG) of the e-beam writer; and with the e-beam writer, using the DPG to print a pattern on a substrate.

19. The method of claim 18, wherein the DPG includes a plurality of pixels that are dynamically and individually controllable.

20. The method of claim 18, further comprising:

with the scheduling engine, receiving data indicating the availability of the output buffer; and with the scheduling engine, receiving data indicating the vacancy of the memory device.

* * * * *